(12) United States Patent
Druzhinina et al.

(10) Patent No.: US 12,325,911 B2
(45) Date of Patent: Jun. 10, 2025

(54) METHOD AND APPARATUS FOR FORMING A PATTERNED LAYER OF MATERIAL

(71) Applicant: ASML NETHERLANDS B.V., Veldhoven (NL)

(72) Inventors: Tamara Druzhinina, Eindhoven (NL); Jim Vincent Overkamp, Eindhoven (NL); Alexey Olegovich Polyakov, Veldhoven (NL); Teis Johan Coenen, Vught (NL); Evgenia Kurganova, Nijmegen (NL); Ionel Mugurel Ciobica, Eindhoven (NL); Alexander Ludwig Klein, Eindhoven (NL); Albertus Victor Gerardus Mangnus, Eindhoven (NL); Marijke Scotuzzi, Eindhoven (NL); Bastiaan Maurice Van Den Broek, Sprang-Capelle (NL)

(73) Assignee: ASML NETHERLANDS B.V., Veldhoven (NL)

( * ) Notice: Subject to any disclaimer, the term of this patent is extended or adjusted under 35 U.S.C. 154(b) by 51 days.

(21) Appl. No.: 17/600,493

(22) PCT Filed: Mar. 20, 2020

(86) PCT No.: PCT/EP2020/057781
§ 371 (c)(1),
(2) Date: Sep. 30, 2021

(87) PCT Pub. No.: WO2020/207759
PCT Pub. Date: Oct. 15, 2020

(65) Prior Publication Data
US 2022/0213593 A1    Jul. 7, 2022

(30) Foreign Application Priority Data

| Apr. 12, 2019 | (EP) | 19168949 |
| Jun. 4, 2019 | (EP) | 19178048 |
| Dec. 12, 2019 | (EP) | 19215592 |

(51) Int. Cl.
*C23C 16/00* (2006.01)
*C23C 16/26* (2006.01)
(Continued)

(52) U.S. Cl.
CPC .............. *C23C 16/26* (2013.01); *C23C 16/48* (2013.01); *C23C 16/56* (2013.01); *G03F 1/22* (2013.01);
(Continued)

(58) Field of Classification Search
CPC ...................................................... C23C 16/00
See application file for complete search history.

(56) References Cited

U.S. PATENT DOCUMENTS

| 4,701,347 A | 10/1987 | Higashi |
| 6,309,798 B1 | 10/2001 | Reetz et al. |

(Continued)

FOREIGN PATENT DOCUMENTS

| CN | 101746709 | 6/2010 |
| EP | 2199434 | 6/2010 |

(Continued)

OTHER PUBLICATIONS

Refractive index of Si-Silicon (Year: 1983).*

(Continued)

*Primary Examiner* — Gordon Baldwin
*Assistant Examiner* — Mohammad Mayy
(74) *Attorney, Agent, or Firm* — Pillsbury Winthrop Shaw Pittman, LLP

(57) ABSTRACT

Methods and apparatus for forming a patterned layer of material are disclosed. In one arrangement, a selected portion of a surface of a substrate is irradiated during a deposition process, the irradiation being such as to locally (Continued)

drive the deposition process in the selected portion to form a layer of deposited material in a pattern defined by the selected portion. The deposited material is annealed to modify the deposited material.

17 Claims, 10 Drawing Sheets

(51) Int. Cl.
| | |
|---|---|
| *C23C 16/48* | (2006.01) |
| *C23C 16/56* | (2006.01) |
| *G03F 1/22* | (2012.01) |
| *G03F 7/00* | (2006.01) |
| *H01L 21/285* | (2006.01) |

(52) U.S. Cl.
CPC ........ *G03F 7/70033* (2013.01); *H01L 21/285* (2013.01)

(56) References Cited

U.S. PATENT DOCUMENTS

| | | | |
|---|---|---|---|
| 6,627,538 B2 | 9/2003 | Gavish et al. | |
| 6,952,253 B2 | 10/2005 | Lof et al. | |
| 9,040,226 B2* | 5/2015 | Boukaftane | G03F 7/40 430/306 |
| 2003/0124821 A1 | 7/2003 | Robertson | |
| 2003/0141573 A1 | 7/2003 | Ross | |
| 2005/0008864 A1 | 1/2005 | Ingen Schenau et al. | |
| 2006/0216875 A1 | 9/2006 | Ito et al. | |
| 2007/0012950 A1 | 1/2007 | Cain et al. | |
| 2015/0162487 A1* | 6/2015 | Deshazer | H01L 21/268 438/57 |
| 2019/0284694 A1* | 9/2019 | Knisley | F23R 3/002 |

FOREIGN PATENT DOCUMENTS

| | | |
|---|---|---|
| EP | 3533900 | 9/2019 |
| JP | H069198 B2 * | 2/1994 |

OTHER PUBLICATIONS

Refractive index of Al2O3-Aluminium Oxide (Year: 1985).*
"Vacuum ultraviolet photochemical selective area atomic layer deposition of Al2O3 dielectrics", P. R. Chalker, P. A. Marshall, K. Dawson, I. F. Brunell, C. J. Sutcliffe, and R. J. Potter, AIP Advances 5, 017115 (Year: 2015).*
"Rapid thermal processing chamber for in-situ x-ray diffraction", Md. Imteyaz Ahmad, Douglas G. Van Campen, Jeremy D. Fields, Jiafan Yu, Vanessa L. Pool, Philip A. Parilla, David S. Ginley, Maikel F. A. M. Van Hest, and Michael F. Toney, Review of Scientific Instruments 86, 013902 (Year: 2015).*
JPH069198B2_English_Translated, (Year: 1994).*
International Search Report and Written Opinion issued in corresponding PCT Patent Application No. PCT/EP2020/057781, dated Jun. 17, 2020.
Taiwanese Office Action issued in corresponding Taiwanese Patent Application No. 109111971, dated Nov. 27, 2020.
Taiwanese Office Action issued in corresponding Taiwanese Patent Application No. 109111971, dated Feb. 23, 2021.
Office Action issued in corresponding Chinese Patent Application No. 2020800281206, dated Jul. 14, 2023.

* cited by examiner

METHOD AND APPARATUS FOR FORMING A PATTERNED LAYER OF MATERIAL

CROSS-REFERENCE TO RELATED APPLICATIONS

This application is the U.S. national phase entry of PCT Patent Application No. PCT/EP2020/057781, which was filed on Mar. 20, 2020, which claims the benefit of priority of European Patent Application No. 19168949.6, which was filed on Apr. 12, 2019, of European Patent Application No. 19178048.5, which was filed on Jun. 4, 2019, and of European Patent Application No. 19215592.7, which was filed on Dec. 12, 2019, which are incorporated herein in their entireties by reference.

FIELD

The present invention relates to methods and apparatus for forming a patterned layer of material.

BACKGROUND

As semiconductor manufacturing processes continue to advance, the dimensions of circuit elements have continually been reduced while the amount of functional elements, such as transistors, per device has been steadily increasing, following a trend commonly referred to as 'Moore's law'. To keep up with Moore's law the semiconductor industry is seeking technologies that enable creation of increasingly smaller features.

Various deposition technologies exist for fabricating two-dimensional materials. Such deposition technologies include chemical vapor deposition (CVD) and atomic layer deposition (ALD) for example. There is interest in using such deposition technologies to form device structures such as circuit elements as part of semiconductor manufacturing processes. A challenge has been that the deposition technologies usually require high temperatures to work efficiently. High temperatures can degrade or damage previously deposited layers and/or restrict the range of previously deposited layers that can be used. The previously deposited layers must be formed so that they can withstand the high temperatures to an acceptable degree, for example by having melting points above the temperatures reached during the deposition process. A further challenge has been to achieve acceptably high throughput. It is difficult to configure deposition processes such as CVD and ALD so that deposition occurs quickly while maintaining high quality in the deposited material.

SUMMARY

It is an object of the invention to provide alternative or improved methods and apparatus for forming patterned layers.

According to an aspect, there is provided a method of forming a patterned layer of material, comprising: irradiating a selected portion of a surface of a substrate during a deposition process, the irradiation being such as to locally drive the deposition process in the selected portion and thereby form a layer of deposited material in a pattern defined by the selected portion; and annealing the deposited material to modify the deposited material.

Thus, a method is provided in which a modified deposited material is produced through a combination of an irradiation process to drive a deposition process and a separate annealing process. In an embodiment, the modification of the deposited material comprises increasing a degree of crystallinity of the deposited material. Providing a separate annealing process reduces demands on the deposition step. The deposition step can be configured for example to deposit material at a relatively low quality (e.g. in an amorphous rather than crystalline state). Reducing demands on the deposition step may make it possible to perform the deposition step more quickly and/or at lower temperatures than would otherwise be possible. Performing the deposition at lower temperatures reduces the risk of damage to previously deposited layers. The annealing can be performed locally or in a pulsed manner to reduce heating of sensitive portions of previously deposited layers. Performing the deposition more quickly increases throughput.

In an embodiment, the annealing of the deposited material comprises: a first step in which all of the substrate is preheated to a target temperature above room temperature; and a second step, subsequent to the first step, in which a selected local region of the substrate is heated to a temperature above the target temperature, the selected local region being smaller than the whole substrate. The annealing may sequentially heat each of one or more further selected local regions to anneal deposited material in each further selected local region. The preheating reduces the amount of heating that needs to be applied by the localized heating, thereby improving the speed of localized heating and the throughput of the annealing process.

In an embodiment, a first radiation source is used to provide the irradiation to drive the deposition process; a second radiation source is used to anneal the deposited material; and the first radiation source is different to the second radiation source. In an example of such an embodiment, the first radiation source and the second radiation source irradiate the substrate from opposite sides of the substrate. Irradiating the substrate from different sides provides more flexibility in how the respective irradiation systems can be positioned and configured. In other embodiments, the first radiation source and the second radiation source irradiate the substrate from the same side of the substrate.

In an embodiment, the same radiation source is used at different times to provide the irradiation to drive the deposition process and irradiation to anneal the deposited material. This approach avoids the need for separate apparatus to be provided for the two processes. In an example of such an embodiment, the irradiation to drive the deposition process is performed with a finer spatial resolution than the irradiation to anneal the deposited material. Thus, the lower spatial resolution requirements of the annealing process are exploited to adopt a faster, lower resolution irradiation mode, thereby improving throughput.

According to a further aspect, there is provided a method of forming a patterned layer of material, comprising: irradiating a selected portion of a surface of a substrate during a deposition process, the irradiation being such as to locally drive the deposition process in the selected portion and thereby form a layer of deposited material in a pattern defined by the selected portion, wherein: the irradiation is performed using radiation having a wavelength of less than 100 nm in combination with one or more of the following: an electron beam; radiation having a wavelength in the range of 100 nm to 400 nm; and laser radiation.

Thus, a method is provided in which two different forms of irradiation are used to drive the deposition process. The combination of different forms of irradiation provides greater flexibility for optimizing the driving of the deposition process. There is a wider range of modes of interaction between the irradiation and material in the vicinity of the selected portion, thereby providing enhanced scope for generating reactive species to drive the deposition process efficiently.

According to a further aspect, there is provided a method of forming a patterning layer of material, comprising: irradiating a selected portion of a surface of a substrate with electromagnetic radiation having a wavelength of less than 100 nm during a deposition process, the irradiation being such as to locally drive the deposition process in the selected portion and thereby cause the deposition process to form a layer of material in a pattern defined by the selected portion, wherein the deposited material comprises boron.

Thus, a method is provided which uses EUV radiation to drive a deposition process to deposit boron. Boron, for example in the form of a borophene, is more transparent to EUV and more stable than many other materials, such as carbon, that can be deposited using an EUV driven deposition process. Use of boron makes it possible to use a scanning EUV illumination mode, which for other materials would be compromised by excessive plasma-induced etching of deposited material.

According to a further aspect, there is provided a method of forming a patterned layer of material, comprising: using a deposition process to form a layer of material; and irradiating a selected portion of the layer of material with radiation comprising an electron beam, the irradiation being such as to cause removal of the layer of material in the selected portion and thereby form a layer of material in a pattern defined by the selected portion.

The use of an electron beam to perform removal of material provides an alternative approach to electromagnetic radiation assisted removal techniques and is capable of achieving high spatial resolution.

According to a further aspect, there is provided a method of forming a patterned layer of material, comprising: irradiating a selected portion of a surface of a substrate during a deposition process, the irradiation being such as to locally drive the deposition process in the selected portion and thereby form a layer of deposited material in a pattern defined by the selected portion, wherein: the substrate comprises at least a first layer and a second layer before the irradiation of the selected portion of the surface of the substrate during the radiation driven deposition process; the radiation driven deposition process forms the layer of deposited material on the first layer of the substrate; and either or both of the following is satisfied: a) the first layer has a higher absorbance per unit depth, with respect to the radiation used for the radiation driven deposition process, than the second layer; and b) the first layer acts as a catalyst with respect to the radiation driven deposition process such that the deposition process can proceed at a lower temperature than if the deposition process were performed directly on the second layer with the first layer not being present.

Providing a first layer with high absorbance promotes efficient driving of the radiation driven deposition process. Selecting the first layer to act as a catalyst allows the deposition process to proceed efficiently at lower temperatures than would be possible without the catalyst being present. Performing the deposition at lower temperatures reduces the risk of damage to previously deposited layers.

According to a further aspect, there is provided a method of formed a patterned layer of material, comprising: irradiating a selected portion of a surface of a substrate during a deposition process, the irradiation being such as to locally drive the deposition process in the selected portion and thereby form a layer of deposited material in a pattern defined by the selected portion, wherein: the method comprises performing a further deposition process seeded or locally inhibited by deposited material of the layer of deposited material formed by the radiation driven deposition process.

Using the radiation driven deposition process to provide a patterned seed layer or a patterned inhibition layer allows precise and flexible control of deposition in the subsequent further deposition process.

According to a further aspect, there is provided a method of forming a patterned layer of material, comprising: providing a layer of material in an initial pattern on a substrate; and irradiating a selected portion of the substrate during a deposition process seeded or locally inhibited by material of the layer of material in the initial pattern, the irradiation being such as to locally drive the deposition process in the selected portion and thereby form a layer of deposited material in a pattern at least partly defined by the selected portion.

Using a prior deposited patterned seed layer or inhibition layer with the radiation driven deposition process allows benefits of both approaches to be obtained. A resulting patterned layer of material can be formed with high accuracy, flexibility and/or high throughput.

According to a further aspect, there is provided a method of forming a patterned layer of material, comprising: irradiating a selected portion of a surface of a substrate during a deposition process, the irradiation being such as to locally drive the deposition process in the selected portion and thereby form a layer of deposited material in a pattern defined by the selected portion, wherein: the substrate comprises at least a first layer and a second layer before the irradiation of the selected portion of the surface of the substrate during the radiation driven deposition process; the radiation driven deposition process forms the layer of deposited material on the first layer of the substrate; and the method further comprises annealing the first layer to modify the first layer in a process that is locally catalysed by the layer of deposited material.

The radiation driven deposition process allows a solid catalyst to be provided accurately and efficiently in a desired pattern. The patterned catalyst then causes modification of the first layer in a pattern corresponding to the pattern of the catalyst.

According to a further aspect, there is provided a method of forming a patterned layer of material, comprising: irradiating a selected repair portion of a pre-existing patterned layer of material on a substrate, the irradiation being such as to locally drive a repair process in the selected repair portion to at least partially correct one or more imperfections in the pre-existing patterned layer of material, the repair process comprising one or more of the following in the selected repair portion: modification of material; deposition of material; and removal of material.

The repair process improves the quality of the patterned layer of material. The repair process can operate on the material in different ways without requiring transfer between different apparatuses. High quality can be achieved while minimizing the total number of process steps. Minimizing the total number of process steps improves efficiency and reduces defectivity associated with the repair process.

According to a further aspect, there is provided an apparatus for forming a patterned layer of material, comprising: an irradiation system configured to irradiate a selected portion of a surface of a substrate during a deposition process, the irradiation being such as to locally drive the deposition process in the selected portion and thereby form a layer of deposited material in a pattern defined by the selected portion; and an annealing system configured to anneal the deposited material to modify the deposited material.

According to a further aspect, there is provided an apparatus for forming a patterned layer of material, comprising: a first irradiation system configured to irradiate a selected portion of a surface of a substrate during a deposition process with radiation having a wavelength of less than 100 nm; and a second irradiation system configured to irradiate the selected portion of the surface of the substrate during the deposition process with one or more of the following: an electron beam; radiation having a wavelength in the range of 100 nm to 400 nm; and laser radiation, wherein: the first irradiation system and the second irradiation system are configured such that the irradiation locally drives the deposition process in the selected portion to cause formation of a layer of deposited material in a pattern defined by the selected portion.

BRIEF DESCRIPTION OF THE DRAWINGS

Embodiments of the invention will now be described, by way of example only, with reference to the accompanying schematic drawings, in which.

DETAILED DESCRIPTION

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus which uses extreme ultraviolet (EUV) radiation, having a wavelength of less than 100 nm, optionally in the range of 5-100 nm, optionally within a range of 4 nm to 20 nm, for example 6.7 nm or 13.5 nm, may be used to form smaller features on a substrate than a lithographic apparatus which uses, for example, radiation with a wavelength of 193 nm.

In the present document, the terms "radiation" and "beam" are used to encompass all types of electromagnetic radiation unless stated otherwise, including ultraviolet radiation (e.g. with a wavelength of 365, 248, 193, 157 or 126 nm) and EUV (extreme ultra-violet radiation, e.g. having a wavelength in the range of about 5-100 nm), as well as electron beam radiation.

Figure 1:
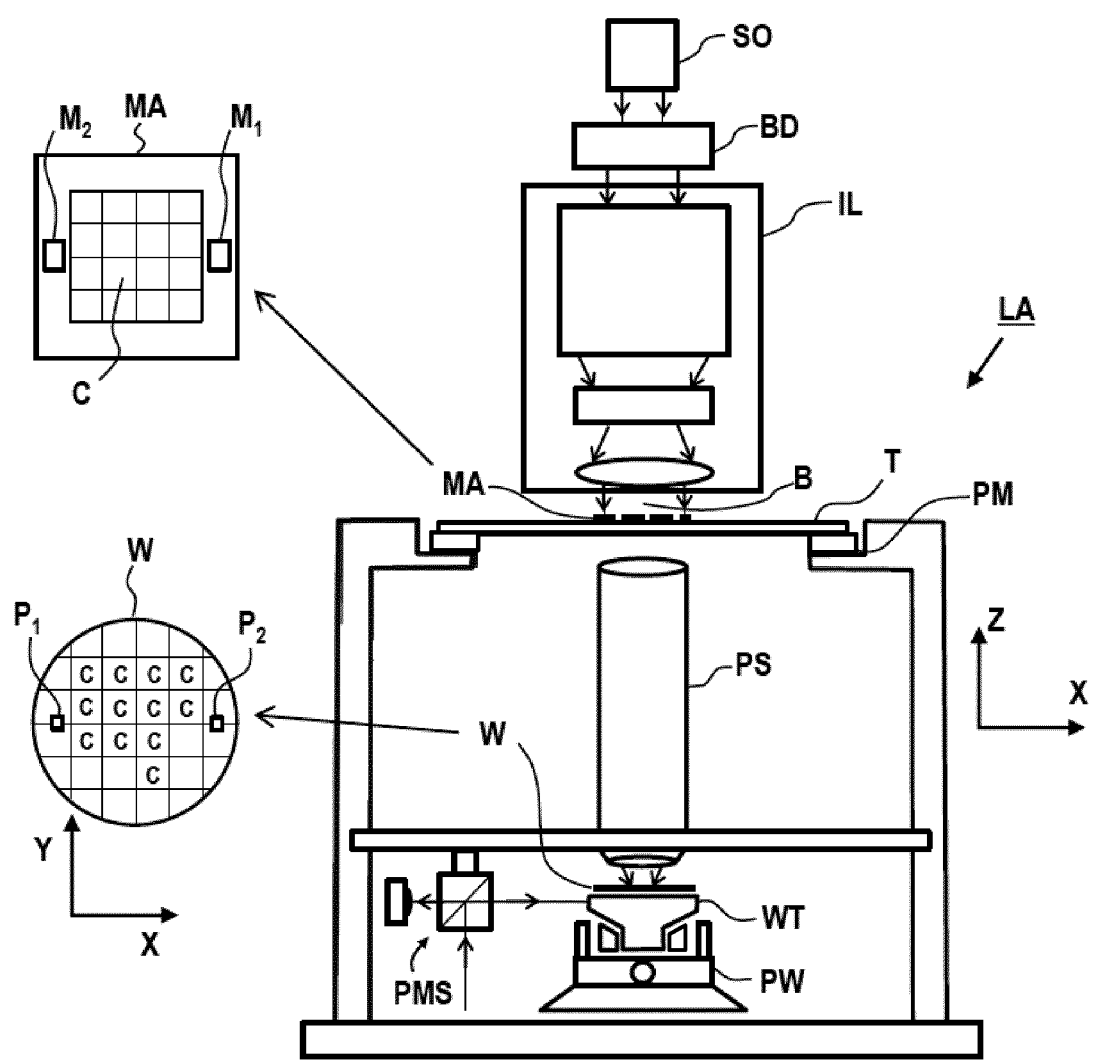
FIG. 1 depicts a first example of a lithographic system comprising a lithographic apparatus and a radiation source.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
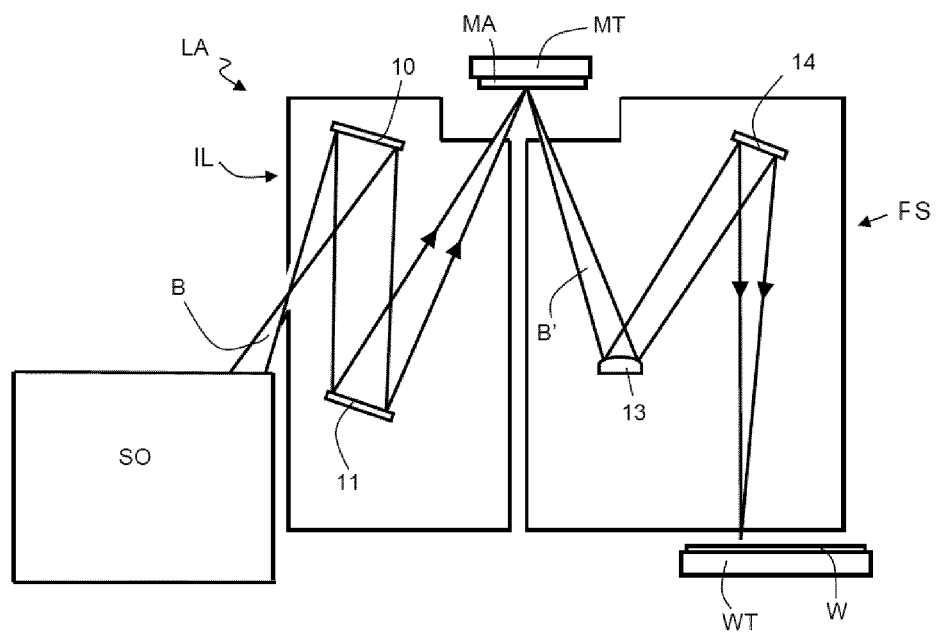
FIG. 2 depicts a second example of a lithographic system comprising a lithographic apparatus and a radiation source.

FIG. 2 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 2, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

As mentioned in the introductory part of the description, although there is interest in using deposition technologies such as CVD or ALD to fabricate two-dimensional materials as part of a semiconductor manufacturing process, there have been several practical challenges. A first challenge is the relatively high temperatures that are required in typical deposition implementations, which could damage previously deposited layers. A second challenge is the relatively slow speed of deposition in the typical deposition implementations, which could limit manufacturing throughput. Embodiments described below address either or both of these challenges.

Figure 3:
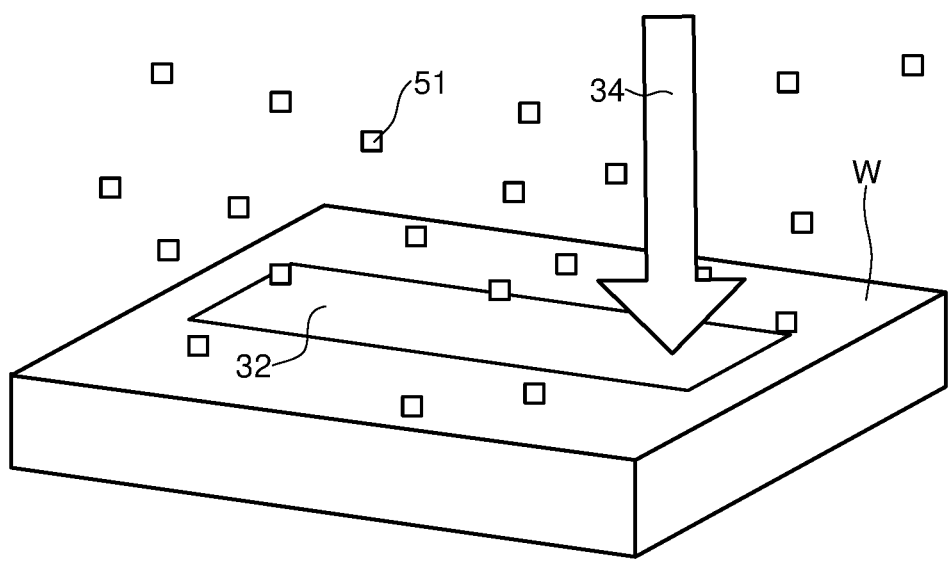
FIG. 3 schematically depicts irradiation of a selected portion on a substrate during a first step of an atomic layer deposition process.
Figure 4:
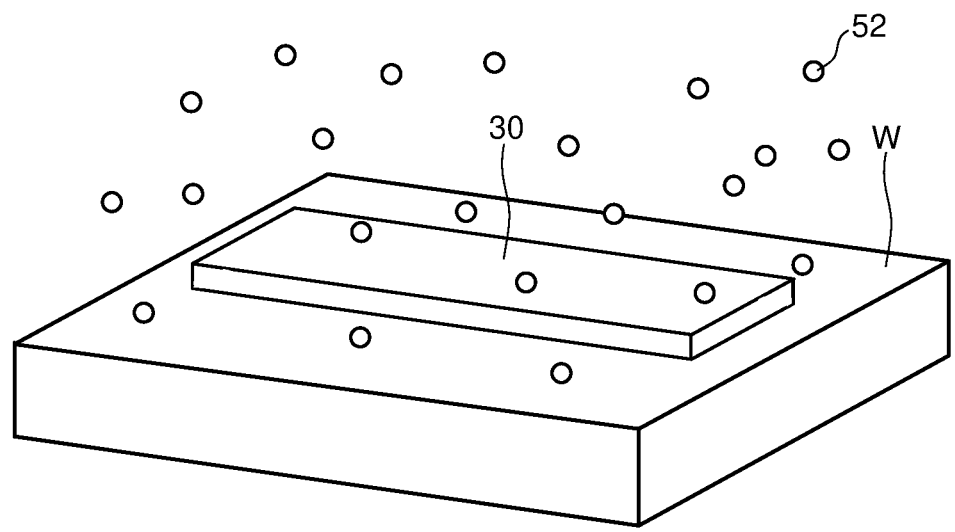
FIG. 4 schematically depicts a step in the atomic layer deposition process subsequent to the step depicted in FIG. 3.

FIGS. 3 and 4 schematically depict formation of a patterned layer of material 30 according to a method of an embodiment. As depicted in FIG. 3, the method comprises irradiating 34 a selected portion 32 of a surface of a substrate W during a deposition process. In an embodiment, the deposition process is configured to form a monolayer (or multiple monolayers if the deposition process is repeated). In the embodiment shown, the deposition process is an atomic layer deposition process. In other embodiments, a different deposition process or combination of deposition processes is used, including for example one or more of the following independently or in combination: atomic layer deposition; chemical vapor deposition; plasma-enhanced chemical vapor deposition; epitaxy; sputtering; and electron beam-induced deposition. The formation of the patterned layer of material 30 may constitute a step in a method of forming at least one layer of a device to be manufactured, such as a semiconductor device.

In an embodiment, the irradiation is performed with radiation that is capable of locally driving the deposition process (e.g. atomic layer deposition process). In an embodiment, the radiation comprises, consists essentially of, or consists of any type of EUV radiation (having a wavelength less than 100 nm) that is capable of locally driving the deposition process (e.g. atomic layer deposition process). The use of EUV radiation provides high spatial resolution. In some other embodiments, the irradiation is performed with radiation comprising, consisting essentially of, or consisting of, higher wavelength radiation, optionally in combination with an immersion liquid, as described below. The higher wavelength radiation may be in the range of 100 nm to 400 nm (including DUV radiation).

The irradiation locally drives the deposition process (in the embodiment shown, the atomic layer deposition process) in the selected portion 32 and thereby causes the formation of a layer of deposited material 30 (see FIG. 4) in a pattern defined by the selected portion 32. A pattern is thus formed without needing any resist. No processing to remove a resist is therefore required, which reduces the risk of damage to the patterned layer of material 30 or to any fragile underlying materials. This approach is particularly desirable where resist residue could significantly impact properties of a fragile underlying material and/or where lift-off of resist could significantly damage a fragile underlying material. Examples of fragile underlying materials include very thin film coatings, 2D materials such as graphene or transitional metal dichalcogenides (TMD), and free-standing membranes or thin films. In contrast to traditional lithography-based semiconductor manufacturing processes, instead of being used to break or cross-link molecules in a resist, radiation is being used to drive one or more chemical reactions involved in the deposition process (e.g. atomic layer deposition process).

Atomic layer deposition is a known thin-film deposition technique in which each of at least two chemicals (which may be referred to as precursor materials) are made to react with the surface of a material in a sequential, self-limiting, manner. In contrast to chemical vapor deposition, the two precursor materials are not normally present simultaneously above the substrate W.

In at least some embodiments using atomic layer deposition, the atomic layer deposition comprises at least a first step and a second step. In the first step, an example of which is depicted in FIG. 3, a first precursor material 51 is made to react with a surface of a substrate W. In the second step, an example of which is depicted in FIG. 4, a second precursor material 52 is made to react with the substrate W in a region where the first precursor 51 reacted with the substrate W in the first step (in this example the selected portions 32).

Figure 5:
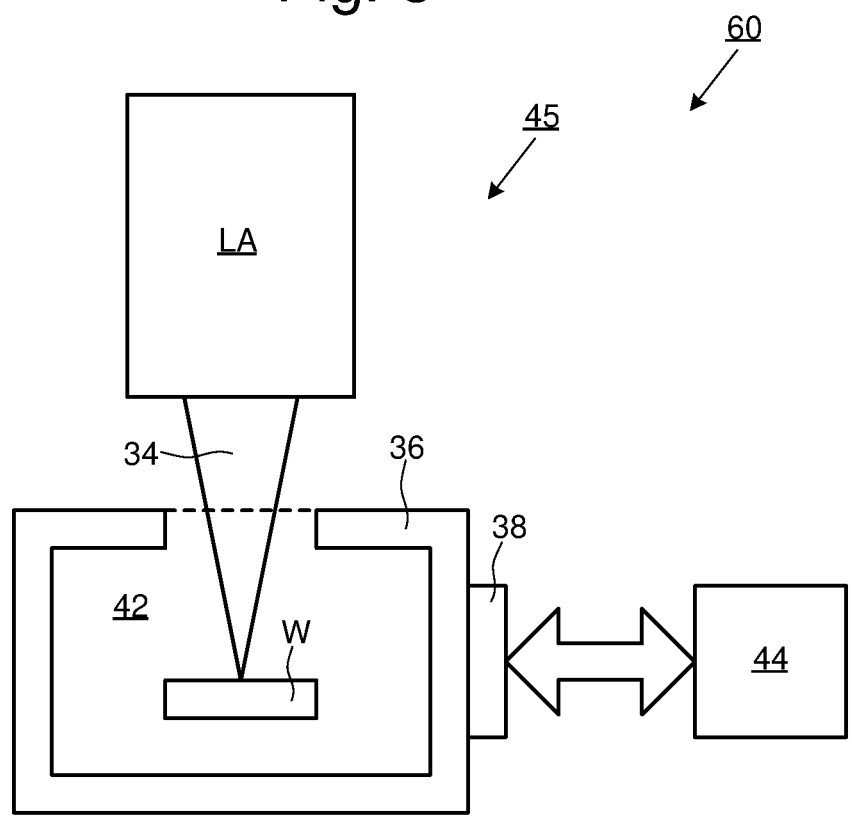
FIG. 5 schematically depicts a lithographic apparatus providing radiation to an environment control system according to an embodiment.

FIG. 5 schematically depicts an apparatus 60 for performing the method. The apparatus 60 thus forms a patterned layer of material. The apparatus 60 comprises an irradiation system. The irradiation system may comprise a lithographic apparatus LA. The lithographic apparatus LA irradiates the selected portion 32 by projecting a patterned radiation beam from a patterning device MA onto the substrate W. The lithographic apparatus LA may be configured as described above with reference to FIG. 1 (e.g. when the irradiation comprises DUV radiation and/or immersion lithography is required) or as described above with reference to FIG. 2 (e.g. when the irradiation comprises EUV radiation).

In an embodiment, the lithographic apparatus LA is configured to perform immersion lithography. In such an embodiment, the atomic layer deposition process may comprise a step in which the selected portion 32 is irradiated while the selected portion 32 is in contact with an immersion liquid. Thus, for example, the atomic layer deposition process may comprise a first step comprising adsorption of a precursor from a gaseous precursor material to the substrate W and a second step in which the adsorbed precursor is modified in the selected portion 32 (e.g. to remove a by-product of the adsorption process) by irradiation through the immersion liquid. Any by-product produced by the irradiation through the immersion liquid can conveniently be carried away by flow of the immersion liquid. In an embodiment, the irradiated substrate W is subsequently dried and any further required processing is performed on the dried substrate W.

In an embodiment, an environment control system 45 is provided. The environment control system 45 allows the composition of the environment 42 above the substrate W to be controlled in such a way as to allow the deposition process (e.g. atomic layer deposition process) to proceed. In an embodiment, the environment control system 45 comprises a chamber 36 to provide a sealed environment 42 including the selected portion 32 of the surface of the substrate W. In some embodiments, all of the substrate W will be within the chamber 36 during the deposition process (e.g. atomic deposition process). In an embodiment, a materials exchange system 38 (e.g. a port into the chamber 36 and associated valves and/or conduits) is provided that allows materials to be added to and removed from the sealed environment 42 to allow different compositional environments to be established within the sealed environment 42. Materials may be provided to and from the materials exchange system 38 by a flow manager 44. The flow manager 44 may comprise any suitable combination of reservoirs, ducting, valves, sinks, pumps, control systems, and/or other components necessary to provide the required flows of materials into and out of the chamber 36. The different compositional environments achieved in this way may correspond to different respective stages of a atomic layer deposition process. In some embodiments, the materials added to and removed from the chamber 36 are gaseous, thereby providing compositional environments consisting of different combinations of gases. In an embodiment in which one or more steps of the deposition process (e.g. atomic layer deposition process) are performed by irradiating the substrate W through an immersion liquid, the environment control system 45 may be configured to allow switching between a state in which a controlled liquid environment is maintained above the substrate W (e.g. during exposure in an immersion lithography mode) and a state in which a controlled gaseous environment is maintained above the substrate W (e.g. during adsorption of a precursor from a gaseous precursor material).

In some embodiments, the driving of the deposition process (e.g. atomic layer deposition process) in the selected portion 32 comprises driving a chemical reaction involving a precursor material. The precursor material will be provided as part of the compositional environment established above the substrate during the irradiation. The driving of the chemical reaction may cause the chemical reaction to proceed at a faster rate than would be the case in the absence of the irradiation. Alternatively, the chemical reaction may be such that it would not occur at all in the absence of the irradiation. In an embodiment, the chemical reaction is endothermic and the irradiation provides the energy necessary to allow the chemical reaction to proceed. In some embodiments, the chemical reaction is at least partially driven by heat generated in the substrate W by the irradiation. Thus, the chemical reaction being driven by the irradiation may comprise a chemical reaction that requires an elevated temperature to proceed or which proceeds more rapidly at elevated temperatures. In some embodiments, the chemical reaction comprises a photochemical reaction driven by the irradiation. Thus, at least one species involved in the chemical reaction directly absorbs a photon from the irradiation and the absorption of the photon allows the chemical reaction to proceed. In some embodiments, the photochemical reaction comprises a multi-photon photochemical reaction involving absorption of two or more photons by each of at least one species involved in the photochemical reaction. The requirement for two or more photons to be absorbed makes the chemical reaction much more sensitive to variations in the intensity of the irradiation (i.e. the rate of the chemical reaction varies much more strongly as a function of intensity) than would be the case for single photon photochemical reactions. The increased sensitivity to intensity provides improved lateral contrast. In an embodiment, a combination of a photochemical reaction and radiation induced heating is used to provide a well-defined process window in which the chemical reaction is driven locally to produce the pattern. In an embodiment, the chemical reaction is driven by a plasma generated by interaction between the radiation and the substrate W, a layer formed on the substrate W, and/or a gas present above the substrate. In an embodiment, the generated plasma is generated in a localized region defined by the irradiation. In an embodiment, the chemical reaction is driven by electrons provided by the irradiation. The electrons may comprise photoelectrons or secondary electrons (electrons generated by inelastic scattering events of a photoelectron or of electrons from an e-beam). In an embodiment, photons absorbed by the substrate W may provide energetic electrons near the surface of the substrate W that participate in the deposition process. In embodiments where a combination of electromagnetic radiation and an e-beam is used, a portion of the deposition process may be driven by electrons from the e-beam.

In some embodiments, flow dynamics of gaseous/liquid co-reactants and/or catalysts and/or precursors are controlled during the deposition process. The control of the flow dynamics can improve the quality of material deposited. The control of flow dynamics may include controlling a direction of the flow (or a vector flow field of the flow). Alternatively or additionally the control of flow dynamics may include controlling a rate of the flow, including for example providing a pulsed flow. In an embodiment, the control of flow dynamics is performed so as to create locally in space and/or time a high density of relevant particles near the deposition location and a low density of the particles near other surfaces (e.g. optics).

In some embodiments, the compositional environment is controlled to provide different mixtures of gases at different times. The different mixtures of gases may be provided to deposit different materials or to switch between a mode where material is deposited and a mode in which material is etched away. The different mixtures of gases may also be used to controllably vary a rate of deposition as a function of time, which may be useful for example to create features with well-defined edges and/or shapes.

In some embodiments, a charging balance is controlled during the deposition process using pre-charging and/or continuous charging. The pre-charging and/or continuous charging may be provided for example using an electron flood gun or by a photoemission mechanism (e.g. using a laser).

Low-energy electrons (like secondary or backscatter electrons escaping from a substrate-vacuum interface) can induce chemical reactions with molecules on or above a substrate surface. The reaction rates depend on the number and energy of the low-energy electrons present. For non-conducting materials the emission of electrons from the substrate (e.g. by EUV irradiation) causes positive charging of the substrate W. This charging influences the electron yield from the substrate W and the trajectories and energies of electrons leaving the substrate W. The charging thus influences the electron density on or above the substrate surface and can be used to control reaction rates during deposition processes or other processes. Using an electron flood gun allows for additional positive or negative sample charging (depending on the electron beam landing energy). Using a laser beam causes additional positive charging via the photoelectric effect. Further process control can be achieved by tuning the electron beam energy or the laser beam wavelength to vary an average depth where the electrons are generated.

In the example of FIGS. 3 and 4, the substrate W is irradiated in the first step only of the atomic layer deposition. In other embodiments, the irradiation of the selected portion 32 is performed during the second step only or during the first step and the second step. In embodiments not involving immersion liquid, the irradiation of the selected portion 32 in at least one of the two steps is performed using EUV radiation. Irradiation may additionally be performed in one or more other steps using other forms of irradiation (with or without an immersion liquid), including DUV radiation.

For many deposition materials, it is necessary to perform the deposition process at an elevated temperature in order for the layer of deposited material to have a level of quality that is suitable for inclusion in a device (e.g. semiconductor device) being manufactured. For example, where the deposited material is required to form a highly conductive thin track, conductivity of the track must be suitably high. The elevated temperature provides the energy necessary for atoms in the deposited material to rearrange into a higher quality state (e.g. a more crystalline state).

In a class of embodiments, such high temperatures are avoided by including an additional step of annealing the deposited material to modify the deposited material. The modification may take various forms, including increasing a degree of crystallinity of the deposited material. For example, the annealing may comprise converting an amorphous material to a crystalline form of the material or increasing a grain size of a material that already has a degree of crystallinity. The irradiation to drive the deposition process and the annealing may be performed in sequence, one after the other. In an embodiment, the sequence is repeated to progressively build up multiple layers of the deposited material 30 in the selected portion 32.

The nature of the deposited material 30 is not particularly limited, as long as the deposited material 30 can be deposited in the manner described and subsequently annealed to modify the deposited material 30. In one class of embodiments, the material comprises, consists essentially of, or consists of carbon. In such embodiments, the modification of the material may comprise conversion of amorphous carbon into a crystalline form of carbon such as graphene or modification of the carbon to increase an average grain size of the carbon.

In an embodiment, the annealing of the deposited material is performed by irradiation with electromagnetic radiation. Annealing by such irradiation makes it possible to provide heating that is localized to the plane of the substrate W or even to a localized region within the substrate W. Temperatures suitable for effective annealing can thus be reached in localized regions where it is required, while temperatures elsewhere can be kept lower. Previously deposited layers can thus avoid reaching temperatures that would be high enough to damage the previously deposited layers (e.g. by causing melting).

In an embodiment, the same radiation source is used at different times to provide the irradiation to drive the deposition process and the irradiation to anneal the deposited material 30. In the example of FIG. 5, for example, the same lithographic apparatus LA could be used to perform both the irradiation to drive the deposition process and the irradiation to anneal the deposited material 30.

In an embodiment, the irradiation of the selected portion 32 is performed with a finer spatial resolution at the substrate W than the irradiation to anneal the deposited material 30. In the case where a lithographic apparatus LA using EUV radiation is used, for example, EUV radiation may be applied through a patterning device MA (e.g. a mask) that patterns the EUV radiation and thereby defines the pattern of the layer of deposited material 30 to be formed. This approach achieves high levels of localization, sharp edges, pitch and critical dimension (CD). When the irradiation is applied to anneal the deposited material 30, the lithographic apparatus LA may illuminate the substrate W without a patterning device and/or with a different (lower resolution) patterning device and/or with the EUV radiation defocussed so as to spread over a larger area. Illumination without a patterning device is sometimes referred to as flood exposure. Annealing using such a flood exposure can increase throughput significantly relative to other modes of illumination.

Figure 6:
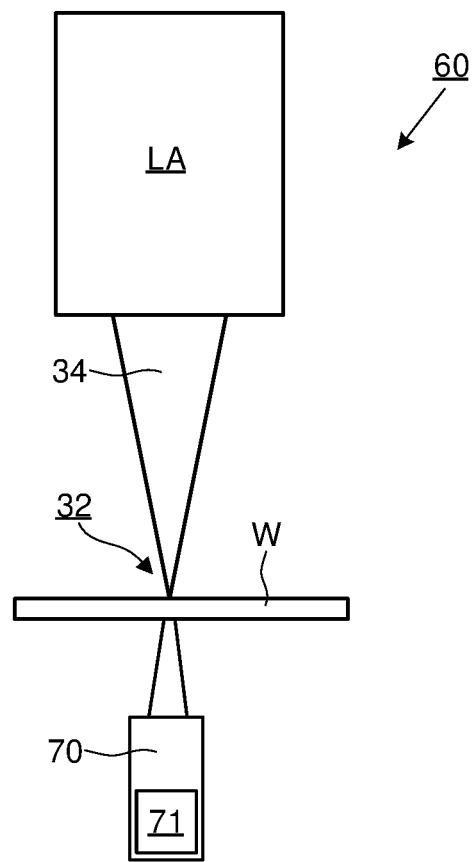
FIG. 6 schematically depicts an apparatus for forming a patterned layer of material comprising an irradiation system and an annealing system.

In a further class of embodiment, a first radiation source SO is used to provide the irradiation to drive the deposition process. A second radiation source 71 is used to anneal the deposited material 30. The first radiation source SO is different to the second radiation source 71. This approach allows each radiation source to be optimised for the respective process it is required to perform (i.e. driving the deposition process or annealing the deposited material 30). An example apparatus for implementing an embodiment of this type is depicted in FIG. 6. In an embodiment, the first radiation source SO and the second radiation 71 source irradiate the substrate W from opposite sides of the substrate W. This approach provides greater flexibility for positioning hardware to implement the respective irradiation processes. An example of such an arrangement is depicted in FIG. 6. In this embodiment, a first radiation source SO in a lithographic apparatus LA irradiates the selected portion 32 to define the pattern to be formed. A second radiation source 71 in a laser unit 70 (which is an example of an annealing system) irradiates the substrate W, from an opposite side of the substrate W to the deposited material 30, to provide the annealing of the deposited material 30. In this arrangement the annealing may be performed at the same time as the deposition process is being performed or at later time. In one embodiment, the annealing is performed on one portion of the substrate W while the deposition process is being applied to a different portion of the substrate W. The positioning of a laser spot to perform the annealing may thus positionally lag behind the progression of the irradiation to drive the deposition on the other side of the substrate W (i.e. to heat a portion of the substrate W that has been irradiated by the lithographic apparatus LA at an earlier time). In other embodiments, as in the example discussed above with reference to FIG. 5 where the same lithographic apparatus LA is used both to perform the irradiation to drive the deposition process and the irradiation to anneal the deposited material 30, the radiation source used to anneal the deposited material 30 irradiates the substrate W from the same side of the substrate W as the deposited material 30.

In another class of embodiment, the annealing of the deposited material 30 comprises a first step and a second step. In the first step, all of the substrate W is preheated to a target temperature above room temperature. In the second step, subsequent to the first step, a selected local region of the substrate W is heated to a temperature above the target temperature. The second step may be repeated to heat other selected local regions. Each selected local region is smaller than the whole substrate W. In an embodiment, the target temperature is below the temperature needed to perform the annealing effectively and the localized irradiation in the second step locally heats each selected local region to a temperature that is effective for annealing. In an embodiment, the target temperature is below a temperature that would damage any previously deposited layers. The target temperature may thus depend on the nature of the previously deposited layers and/or, therefore, on the stage of a manufacturing process at which the deposition is to be performed. In an embodiment, the target temperature is less than 1000 degrees C. In an embodiment, the target temperature is less than 400 degrees C. In an embodiment, the target temperature is less than 200 degrees C. In an embodiment, the localized heating is at least partly provided by the irradiation used to drive the deposition process. In an embodiment, the localized heating is at least partly provided by irradiating the substrate W separately, for example using a separate radiation source as described above with reference to FIG. 6.

Figure 7:
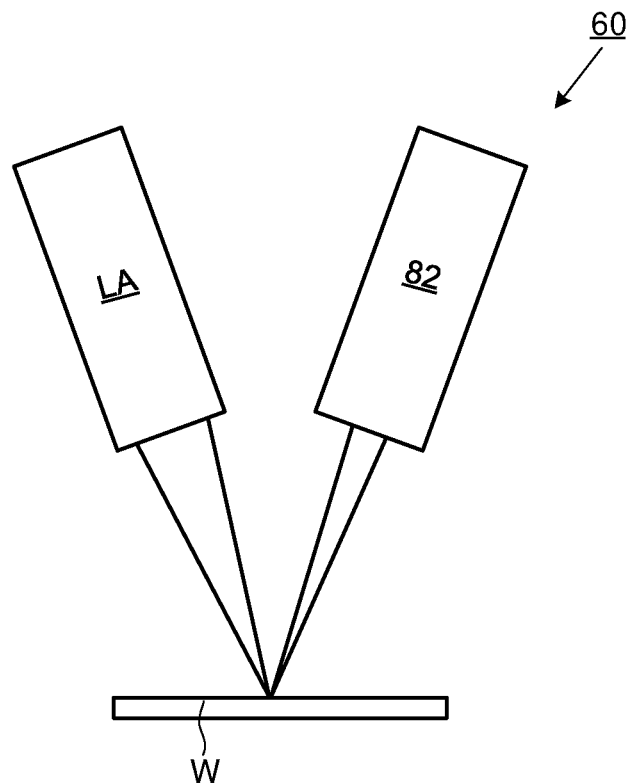
FIG. 7 schematically depicted an apparatus for forming a patterned layer of material comprising a first irradiation system and a second irradiation system.

In a further class of embodiment, as depicted schematically in FIG. 7, the irradiation of the selected portion 32 to drive the deposition process is performed using EUV radiation applied by a first irradiation system (e.g. having a wavelength of less than 100 nm, optionally in the range of 5-100 nm, optionally within a range of 4 nm to 20 nm, for example 6.7 nm or 13.5 nm) in combination with one or more of the following applied by a second irradiation system during the driving of the deposition process: an electron beam; radiation having a wavelength in the range of 100 nm to 400 nm; and laser radiation. An apparatus 80 for implementing an embodiment in which the irradiation of the selected portion to drive the deposition process is performed using radiation having a wavelength of less than 100 nm (supplied via a lithographic apparatus LA acting as the first irradiation system) in combination with an electron beam (supplied by an e-beam source 82 acting as the second irradiation system) is depicted schematically in FIG. 7. The first irradiation system and the second irradiation system are configured such that the irradiation locally drives the deposition process in the selected portion 32 to cause formation of the layer of deposited material 30 in the pattern defined by the selected portion 32.

The driving of the deposition process by the EUV radiation often occurs predominantly by the EUV radiation interacting with solid material (e.g. the substrate W or layers formed on the substrate W) to liberate electrons from the solid material and thereby form a plasma. The plasma drives chemical reactions involved with the deposition process. Using an e-beam in combination with the EUV radiation provides a high concentration of electrons and/or further contributes to breaking bonds to create reactive species, thereby promoting faster deposition of material.

Figure 8:
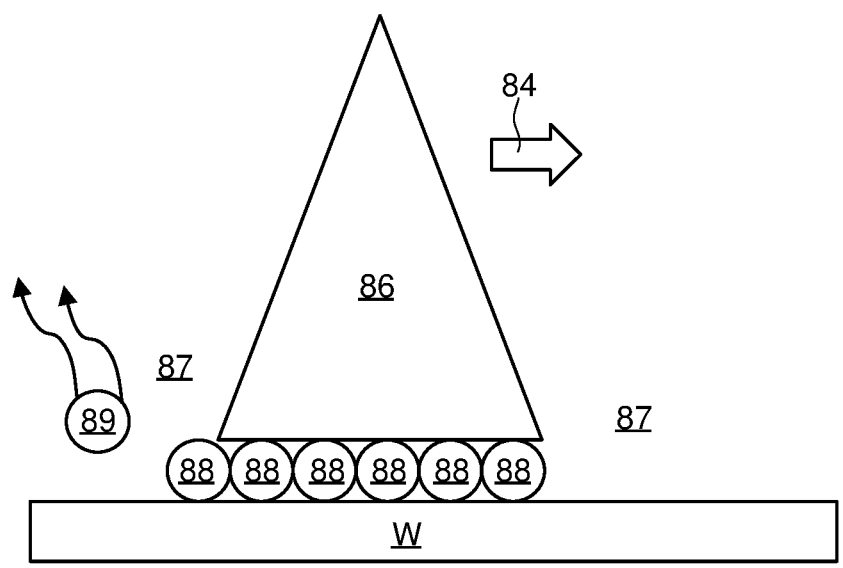
FIG. 8 schematically depicts plasma-induced etching of deposited material in the wake of a scanning EUV radiation beam.

In an embodiment, the deposited material comprises, consists essentially of, or consists of, boron, optionally a monolayer of boron. In an example of such an embodiment, the modification of the deposited material 30 caused by the annealing comprises modification of the boron to become more crystalline, including transforming the boron into a borophene. In an embodiment, the borophene is formed directly by the irradiation of the selected portion 32. In embodiments of this type, the annealing may or may not be performed to improve the deposited material 30. In an embodiment of this type, the deposition process providing the deposited boron is driven by irradiating the selected portion 32 of the substrate with EUV radiation (e.g. having a wavelength of less than 100 nm, optionally in the range of 5-100 nm, optionally within a range of 4 nm to 20 nm, for example 6.7 nm or 13.5 nm). As described above, the EUV radiation interacts with solid material to liberate electrons, which then act to drive the deposition process. In an embodiment, as depicted schematically in FIG. 8, the irradiation is performed by scanning an EUV radiation beam 86 over the substrate W. In the schematic triangular region of the EUV radiation beam 86, particles 88 deposited on the surface of the substrate W are exposed to EUV radiation and to plasma created by the EUV radiation. The net effect in this region is to drive the deposition process, such that particles 88 are attached to the surface of the substrate W. Plasma 87 created by the EUV radiation beam 86 is present, however, in regions close to where the EUV radiation beam is scanning, for example in the wake of the EUV radiation beam 86. This plasma can act as an etchant and remove material that has recently been deposited by the EUV radiation beam 86. The detachment of particle 89 by such etching is depicted schematically in FIG. 8 on the left-hand side of the EUV radiation beam 86, which is being scanned towards the right (arrow 84). In comparison with other materials, including carbon for example, boron is more transparent to EUV radiation and resistant to plasma-induced etching processes. The extent to which deposited material is lost due to etching is therefore reduced, thereby increasing a net rate of deposition. The resistance to etching allows scanning modes (instead of or in addition to stepping modes) to be used, which for other materials would cause loss of material due to plasma-induced etching to increase to unacceptable levels.

In an embodiment, a pattern in a patterned layer of material is at least partly defined by removing material instead of, or in addition to, selectively depositing material as described in any of the embodiments above. In such embodiments, a deposition process forms a layer of material. The deposition process may be performed in any of the ways described above, including using one or more of the following: atomic layer deposition; chemical vapor deposition; plasma-enhanced chemical vapor deposition; epitaxy; sputtering; and electron beam-induced deposition. A selected portion of the layer of material deposited is irradiated. In an embodiment, the layer of material covers all of an underlying layer or substrate prior to the irradiation (i.e. the layer of material comprises no pattern prior to irradiation). In other embodiments, the layer of material comprises a first pattern and the irradiation refines the first pattern to provide a second pattern, different from the first pattern. The radiation comprises an electron beam. In some embodiments, the radiation further comprises radiation of a different type, such as electromagnetic radiation. In an embodiment, the different type of radiation comprises UV radiation, DUV radiation, EUV radiation, or any combination of two or more of UV, DUV and EUV radiation. The irradiation is such as to cause removal of the layer of material in the selected portion and thereby form a layer of material in a pattern defined by the selected portion. In an embodiment the irradiation is performed in the presence of either or both of hydrogen and a hydrogen-plasma over at least the selected portion being irradiated. The combination of the irradiation and the hydrogen and/or hydrogen-plasma causes etching away of the layer of material (which may comprise solid and/or liquid material) selectively in the selected portion (i.e. etching occurs in the selected portion and not in areas outside of the selected portion).

As discussed above, irradiation may be used to selectively deposit material and to selectively remove material. Irradiation may also be used to modify material to improve a quality of deposited material (e.g. to remove defects or vacancies). Methods of repairing a pre-existing patterned layer of material may be provided based on these principles.

Figure 15:
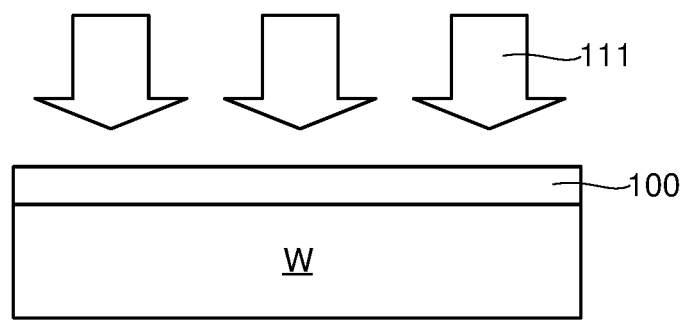
Figure 16:
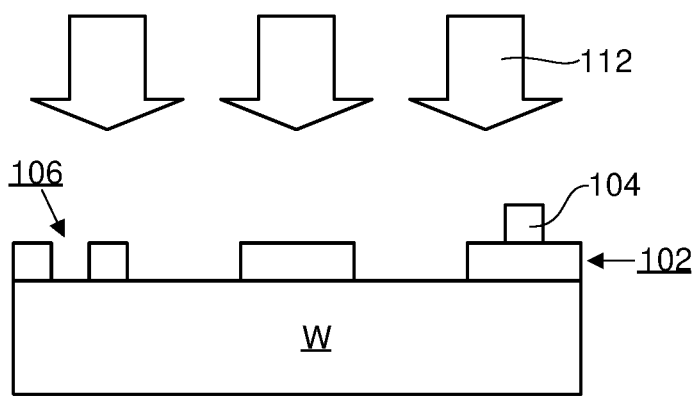
Figure 17:
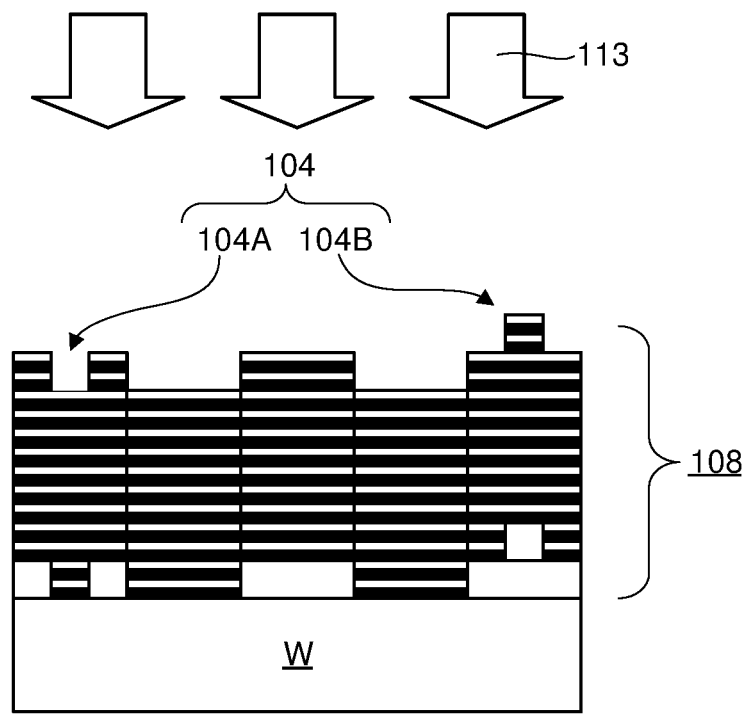

In an embodiment, an example of which is described below with reference to FIGS. 14-18, a method is provided in which a selected repair portion 104 of a pre-existing patterned layer of material 108 on a substrate W is subjected to a repair process comprising irradiation of the pre-existing patterned layer of material 108. In an embodiment, the irradiation is performed using EUV radiation having a wavelength of less than 100 nm (optionally in the range of 5-100 nm, optionally within a range of 4 nm to 20 nm, for example 6.7 nm or 13.5 nm). In the example of FIGS. 14-18, the pre-existing patterned layer of material 108 is provided by the following steps. In a first step, a substrate W (FIG. 14) is subjected to a deposition process 111 to form a deposited layer of material 100 (FIG. 15). In a second step, the deposited layer of material 100 is subjected to a patterning process 112 to form a first patterned layer of material 102 (FIG. 16). In a third step, a further deposition process 113 is performed to build a thicker patterned layer of material 108 based on the first patterned layer of material 102 (FIG. 17). The patterned layer of material 108 is an example of a pre-existing patterned layer of material 108 to which the repair process is applied. Prior to application of the repair process, imperfections in the deposition process 111, the patterning process 112 and/or further deposition process 113 can lead to imperfections in the patterned layer of material 108. In the schematic example shown, two imperfections are depicted in the first patterned layer of material 102. A first imperfection is that a portion 106 of the first patterned layer of material 102 is erroneously missing. A second imperfection is that a contaminant particle 104 is present on the upper surface of the first patterned layer of material 102 where the pattern should have been flat. Contaminant particles may be encountered, for example, where resist-coating processes are used that affect the whole of a wafer being processed. These imperfections in the first patterned layer of material 102 (as shown in FIG. 16) lead to corresponding imperfections in the patterned layer of material 108 produced after the further deposition process 113 (as shown in FIG. 17).

Figure 18:
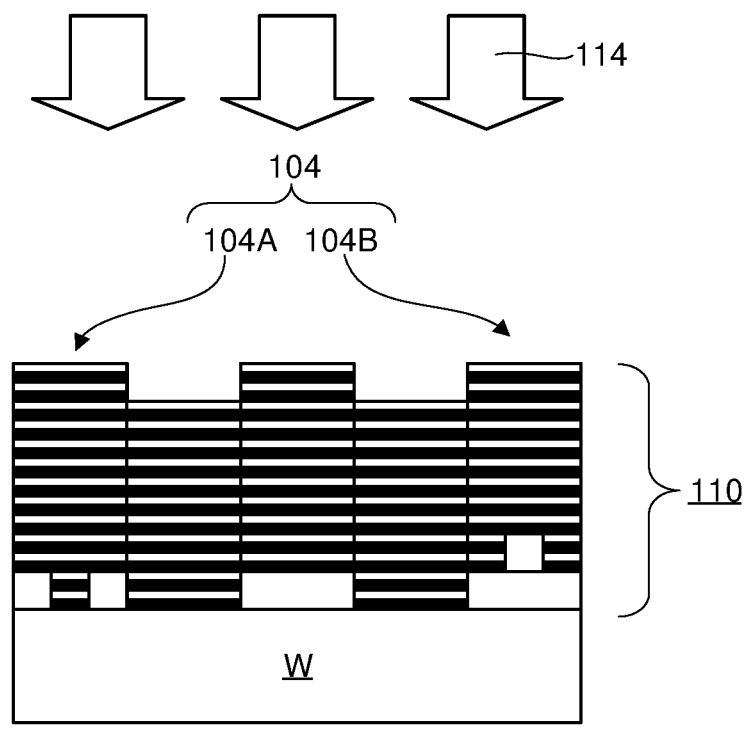

In an embodiment, the patterned layer of material 108 shown in FIG. 17 is subjected to a repair process comprising irradiation 114 of the patterned layer of material 108 to provide a repaired patterned layer of material 110 (FIG. 18). The irradiation is such as to locally drive a repair process in a selected repair portion 104 by irradiating the selected repair portion 104. The repair process can be restricted to the selected repair portion 104 because the repair process is at least partially driven by the irradiation. Restricting the irradiation to the selected repair portion (e.g. not irradiating other portions or irradiating the other portions to a much lower extent) causes the repair process to occur predominantly or exclusively in the selected repair portion, thereby providing the local driving of the repair process. The repair process at least partially corrects one or more imperfections in the pre-existing patterned layer of material 108. In an embodiment, the repair process comprising one or more of the following in the selected repair portion 104: modification of material; deposition of material; and removal of material. An example of a selected repair portion 104 is depicted in FIGS. 17 and 18. The selected repair portion 104 is generally less than all of an upper surface of the substrate W being subjected to the repair process. The irradiation is thus directed selectively to areas to be repaired. Not all of the selected repair portion 104 needs to be irradiated at the same time. Different sub-portions of the selected repair portion 104 can be irradiated at different times. In the example shown, the selected repair portion 104 comprises a first sub-portion 104A and a second sub-portion 104B. In this example, the repair process comprises deposition of new material in the first sub-portion 104A (to repair the defect arising from the erroneously missing portion 106 shown in FIG. 16) and removal of material in the second sub-portion 104B (to repair the defect arising from the contaminant particle 104 shown in FIG. 16). The deposition and removal processes may be performed in the same apparatus (e.g. by changing the compositional environment above the substrate) and without transferring the substrate W between different apparatuses, thereby reducing the total number of process steps and, as a consequence, the defectivity of the repair process. The deposition of material may be performed using any of the methods described above in which a deposition process is locally driven by irradiation. The deposition of material may be performed for example with a compositional environment above the substrate W that contains species suitable for supporting the deposition process, such as suitable precursor materials and/or co-reactant materials and/or catalyst materials. The removal of material may be performed by providing a compositional environment that favours localized etching in the presence of irradiation, such as an atmosphere containing either or both of hydrogen and a hydrogen plasma. In the case where the material to be removed comprises a carbon-based material, the irradiation may be performed in the presence of materials that favour etching of carbon in the presence of irradiation, such as one or more of the following: $H_2O$, $XeF_2$, $NH_3$ and $O_2$. The removal of material may comprise removal of contaminants on the surface (e.g. to clean a surface) and/or etching of erroneously formed structures (as in the example of FIGS. 14-18). EUV radiation is effective for dissociating chemisorbed adatoms, for example, which is useful for removing contamination from a surface. Alternatively, EUV generated secondary electrons can promote adatom chemisorption when performed in a suitable compositional environment, which may allow engineering of electronic structures of 2D materials. In an embodiment, the removal of material is used to separate structures that are erroneously connected together. The deposition of new material and the removal of material may be performed at different times with the compositional environment above the substrate W being purged in between.

In an embodiment, the modification of pre-existing material comprises repairing of internal defects in deposited material. The modification may comprise increasing a degree of crystallinity of a material for example. The defects to be repaired may include atoms wrongly configured in a lattice of deposited material or lattice vacancies.

Direct EUV exposure has been observed to induce defects in bare graphene. It may therefore be beneficial to down-convert EUV photons during the irradiation by generating secondary electrons that have lower energy. For example, incoming EUV photons of ~90 eV may be too high in energy to interact chemically with adsorbates. Secondary electrons derived from the EUV photons may have energies in the range of 0.1-10 eV, which are more suitable for chemically interacting with adsorbates. The generated secondary electrons can be tuned to desired energy bands to optimize the modification of the deposited material (e.g. healing of vacancies, removal of contaminants, repairing of internal defects).

In an of the above-described methods of forming a patterned layer of material, the patterned layer of material can comprise final material that will be present in the device being manufactured (e.g. an IC device). The final material may, for example, comprise a two-dimensional material, such as one or more of the following: graphene, hexagonal boron nitride (hBN), and transition metal dichalcogenides (TMD). Alternatively or additionally, the patterned layer of material can comprise an auxiliary pattern that will contribute functionally to one or more subsequent manufacturing steps. In an embodiment, the auxiliary material functions as a hard mask (when formed from amorphous C for example). In an embodiment, the auxiliary material functions as a material enhancing photo-electron yield (when comprising Sn, In and/or one or more of their compounds for example). In an embodiment, the auxiliary material functions as a precursor and/or co-reactant and/or catalyst (e.g. metals and their compounds) for one or more subsequent deposition steps.

Figure 9:
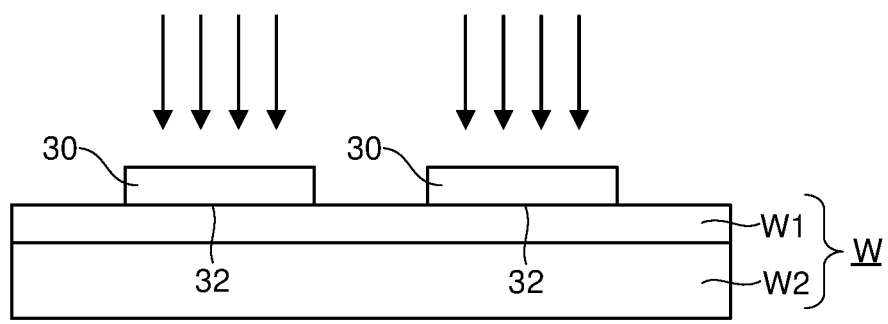
FIG. 9 schematically depicts a radiation driven deposition process performed on a substrate comprising a first layer and a second layer.

In any of the embodiments described above, and in other embodiments, the radiation driven deposition process may be applied to a substrate W comprising plural layers. The plural layers may comprise a silicon wafer as one of the layers and one or more other layers deposited on the silicon wafer (e.g. by spin coating). FIG. 9 depicts an example configuration in which a substrate W is provided having a first layer W1 (e.g. a spin coated layer) and a second layer W2 (e.g. a silicon wafer and/or $SiO_2$ layer). In an embodiment, starting from a substrate W having plural layers such as in FIG. 9, a selected portion 32 of a surface of the substrate W is irradiated. Irradiation is depicted schematically in FIGS. 9-13 by straight, downwardly oriented arrows. In the case of FIG. 9, the radiation impinges on the first layer W1. The irradiation is performed during a deposition process. The irradiation is such as to locally drive the deposition process in the selected portion 32 and thereby form a layer of deposited material 30 in a pattern defined by the selected portion 32. The deposition process is thus a radiation driven deposition process. The radiation driven deposition process may proceed according to any of the mechanisms described above with reference to FIGS. 1-8. In this embodiment, the first layer W1 and the second layer W2 are present before the irradiation of the selected portion 32. Neither of the first layer W1 and the second layer W2 is thus formed by the radiation driven deposition process. The radiation driven deposition process forms the layer of deposited material 30 on the first layer W1 of the substrate W. The first layer W1 is provided on the second layer W2.

In an embodiment, the first layer W1 is configured (e.g. by selecting a suitable composition of the first layer W1) to have a higher absorbance per unit depth, with respect to the radiation used for the radiation driven deposition process, than the second layer W2. In an embodiment, the first layer W1 acts as a catalyst with respect to the deposition process such that the deposition process can proceed at a lower temperature than if the deposition process were performed directly on the second layer W2 with the first layer W1 not being present. In an embodiment, the first layer W1 has a higher absorbance per unit depth, with respect to the radiation used for the radiation driven deposition process, than the second layer W2 and the first layer W1 acts as a catalyst with respect to the deposition process such that the deposition process can proceed at a lower temperature than if the deposition process were performed directly on the second layer W2 with the first layer W1 not being present.

Providing a first layer W1 with a relatively high absorbance (e.g. a higher absorbance per unit depth, with respect to the radiation used for the radiation driven deposition process, than the second layer W2) helps to promote efficient driving of the radiation driven deposition process by increasing the extent to which photons interact with the portion of the substrate W directly adjacent to where material is to be deposited. The increased interaction may for example enhance generation of secondary electrons that participate in the deposition process. This mechanism may be particularly advantageous where the radiation used for the radiation driven deposition process comprises EUV radiation.

Selecting the first layer W1 to act as a catalyst allows the deposition process to proceed efficiently at lower temperatures than would be possible without the catalyst being present. Performing the deposition at lower temperatures reduces the risk of damage to previously deposited layers. The nature of the catalytic action of the first layer W1 may take various forms. In one class of embodiment, the catalytic action comprises promotion of chemical decomposition or transformation of reactants that participate in the deposition process. For example, in a case where the layer of deposited material formed by the radiation driven deposition process comprises graphene, the catalytic action may comprise promotion of lower temperature chemical decomposition of gaseous hydrocarbons such as methane (e.g. using a transition metal catalyst such as Cu, Fe, Co, or Ni).

In an embodiment, the second layer W2 comprises a silicon wafer. In an embodiment, the first layer W1 is provided directly on the second layer W2 (i.e. such that the first layer W1 is in direct contact with the second layer W2). In other embodiments, one or more further layers may be provided between the second layer W2 and the first layer W1. In an embodiment, the first layer W1 comprises a planar unpatterned layer. In an embodiment, the first layer W1 covers a majority or all of the second layer W2, at least on one side of the second layer W2. In an embodiment, the first layer W1 is formed by spin coating.

Various combinations of composition are possible for the first layer W1 and the second layer W2. In a class of embodiments, the first layer W1 comprises a metal or metal oxide. Many metals and metal oxides are good absorbers of EUV radiation as well as showing catalytic behaviour for many deposition processes. In an embodiment, the first layer W1 comprises Ag, Sn, In and/or one or more compounds of Ag, Sn and/or In. In an embodiment, the first layer comprises $AgO_2$ and/or $SnO_2$. In an embodiment, the first layer W2 comprises a transition metal and/or a transition metal alloy and/or transition metal oxide. In one particular embodiment, the first layer W1 comprises Cu and the deposited material formed using the radiation driven deposition process comprises graphene. In another embodiment, the first layer W1 comprises Mo and/or a carbide of Mo. Multiple layer graphene can be grown directly on the Mo and/or carbide of Mo, optionally via solid amorphous carbon as a precursor.

In an embodiment, the method further comprises annealing the first layer W1 to modify the first layer W1 in a process that is locally catalysed by the layer of deposited material 30. In an embodiment, the first layer W1 comprises amorphous carbon and the deposited material formed using the radiation driven deposition process comprises a catalyst for growing graphene in the annealing process using the amorphous carbon as precursor. In an embodiment of this type, the second layer W2 may comprise $SiO_2$ for example. In an embodiment, the catalyst comprises Mo and/or a carbide of Mo and/or another suitable transition metal or transition metal compound (e.g. Ni and compounds of Ni with C and/or Si) that catalyses the growth of graphene from the amorphous carbon precursor. The growth of graphene according to this approach may occur via a solid phase reaction starting from the amorphous carbon. The radiation driven deposition process allows the catalyst to be deposited accurately in a desired pattern. The deposited catalyst may be removed after the growth of the graphene underneath the catalyst has been completed, thereby providing a patterned layer of graphene (on a layer of $SiO_2$ for example).

Any of the embodiments described with reference to FIGS. 1-8 in which an annealing step is performed after the radiation driven deposition process may be performed using a substrate W having the first layer W1 and the second layer W2 as described above.

Figure 10:
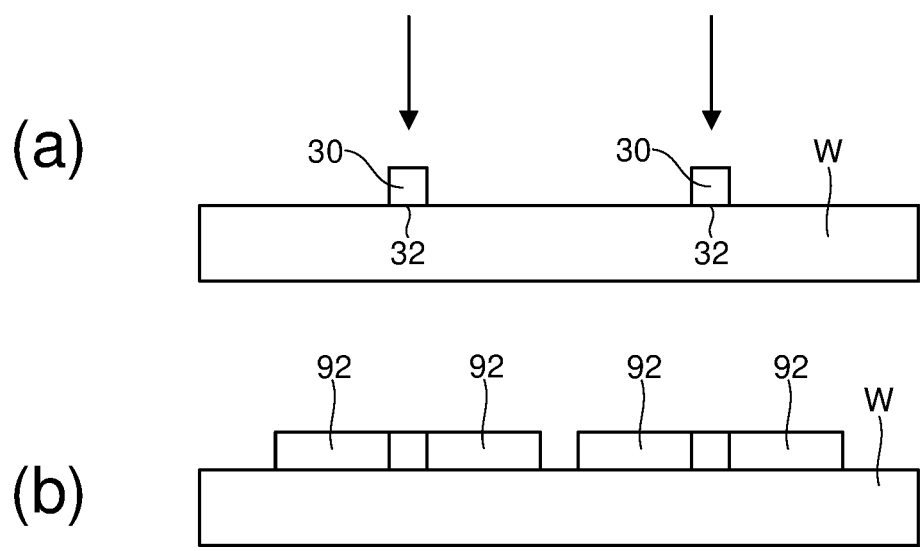
FIG. 10 schematically depicts a two-step method in which a radiation driven deposition process is used in a first step (a) to form a layer of deposited material that seeds a deposition process used in a second step (b)
Figure 11:
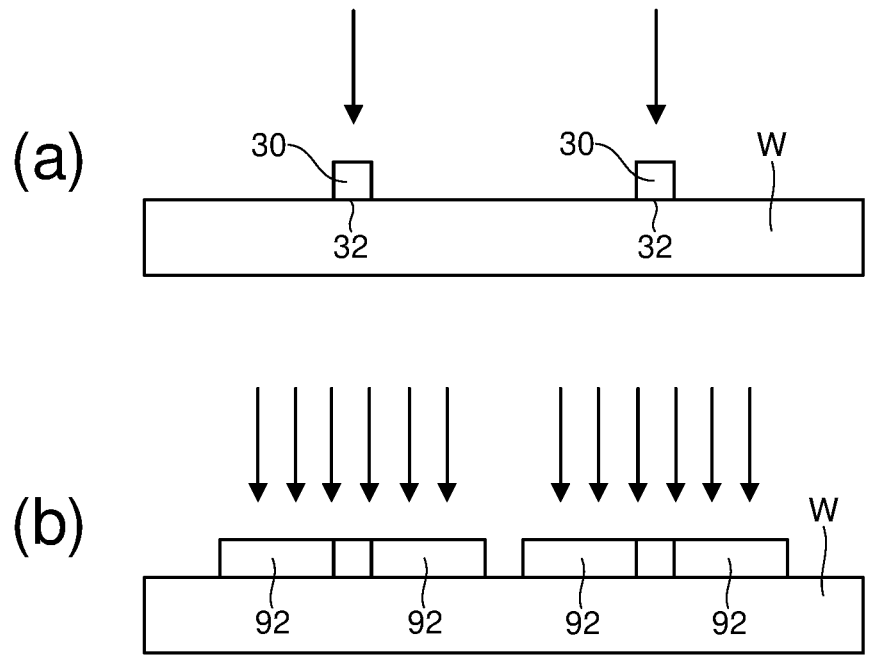
FIG. 11 schematically depicts an alternative two-step method in which a first radiation driven deposition process is used in a first step (a) to form a layer of deposited material that seeds a second radiation driven deposition process used in a second step (b)

In a further embodiment, the layer of material 30 formed using the radiation driven deposition process of any of the above embodiments is used to seed a further deposition process. FIGS. 10 and 11 schematically depict two example process flows.

In FIG. 10(a), a selected portion 32 of a surface of a substrate W is irradiated during a deposition process. The irradiation is such as to locally drive the deposition process in the selected portion 32 and thereby form a layer of deposited material 30 in a pattern defined by the selected portion 32. This radiation driven deposition process may be performed using any of the techniques described above. In FIG. 10(b), a further deposition process is performed. The further deposition process is seeded by deposited material of the layer of deposited material 30 formed by the radiation driven deposition process (in the step of FIG. 10(a)). The layer of deposited material 30 may in this case be referred to as a seed layer. The further deposition process forms further deposited material 92. The further deposited material 92 grows (horizontally outwards in the orientation of FIG. 10(b)) starting from deposited material of the layer of deposited material 30 acting as seed material. Various mechanisms of seeding may be present depending on the materials involved. The layer of deposited material 30 may for example act as any one or more of the following during the seeding process: a catalyst; a precursor; a coreactant; and a final material that will be present in the device being manufactured. For example, in a case where the further deposited material 92 comprises graphene (as a final material), the layer of deposited material 30 acting as seed layer may comprise carbon.

Using the radiation driven deposition process to deposit seed material allows the seed material to be positioned and/or patterned with high spatial accuracy. Positioning the seed material with high accuracy can improve the spatial precision of features formed by growing the further deposited material 92 from the seed material. The positions of seed material define where growth will start. Patterning the seed material with high accuracy facilitates formation of high-quality crystalline material by growing the further deposited material 92 from the seed material. For example, the seed material can be patterned to reliably favour growth of the further deposited material 92 from the seed material in a crystalline form with a preferred orientation. A two-dimensional material formed using growth of the further deposited material 92 starting from initially separated seed regions of seed material may be of higher quality if the growth from each of the different seed regions is oriented in the same way.

FIGS. 11(a) and 11(b) depict a variation on the arrangement of FIGS. 10(a) and 10(b) in which the further deposition process is performed using irradiation to locally drive the further deposition process to at least partly define a pattern of the further material 92 formed using the further deposition process. The pattern may be defined partly by the previously deposited material 30 (e.g. a spatial pattern of the previously deposited material 30) acting as seed material and partly by the irradiation (e.g. a spatial pattern of the irradiation) during the further deposition process. Thus, a process is provided in which at least two different steps both use a radiation driven deposition process to define where material is deposited: the first step deposits seed material and the second step deposits material seeded by the seed material. The radiation used in the two steps may take any of the forms described above with reference to FIGS. 1-8. The radiation may be the same for the two steps or different. In one class of embodiments, the two different radiation driven deposition steps are performed in different lithographic machines. In another class of embodiments, the two different radiation driven deposition steps are performed in a single common lithographic machine.

FIGS. 12(a) and 12(b) depict a variation on the arrangement of FIGS. 11(a) and 11(b) in which the first step (FIG. 12(a)) comprises deposition of a layer of material 94 acting as seed material in an initial pattern on a substrate W using a deposition process which is not radiation driven. In this case only the second step therefore comprises radiation driven deposition of material. This may facilitate ease of manufacture and/or high throughput by allowing alternative deposition techniques to be used to deposit the seed material (e.g. ink jet deposition or electron beam induced deposition) while still allowing final features to be formed with high locational precision and/or sharp edges due to the high spatial resolution provided by the radiation driven second step (FIG. 12(b)).

In an embodiment, the deposition of seed material (whether by a radiation driven deposition process or not) comprises deposition of multiple different regions of seed material in a pixelated manner via multiple (pixelated) exposures. This approach ensures that local chemistry during deposition of each region is independent of the local chemistry during deposition of all the other regions, thereby avoiding the need for adaptation of the pattern of regions to be formed to take account of the chemical effects from other regions.

Figure 12:
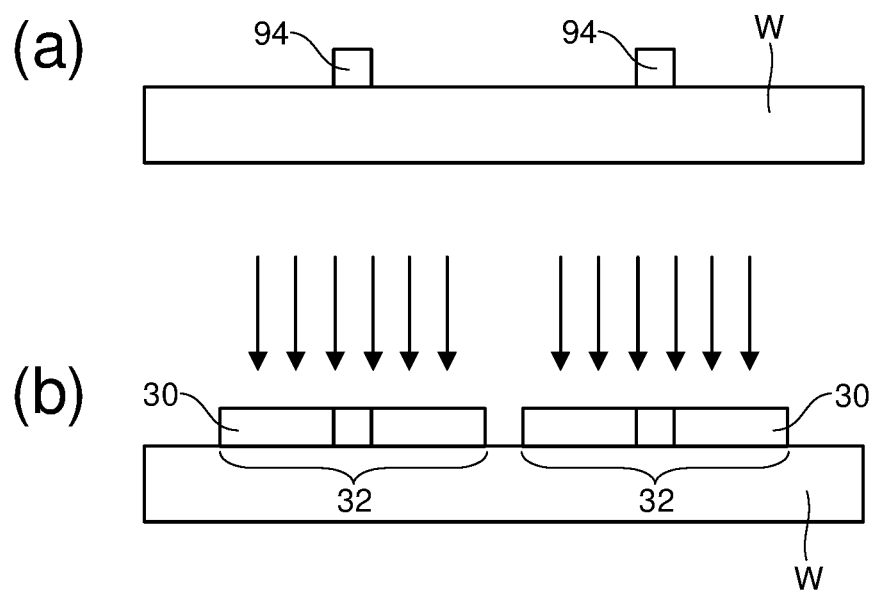
FIG. 12 schematically depicts an alternative two-step method in which material deposited in a first step (a) seeds a radiation driven deposition process used in a second step (b)
Figure 13:
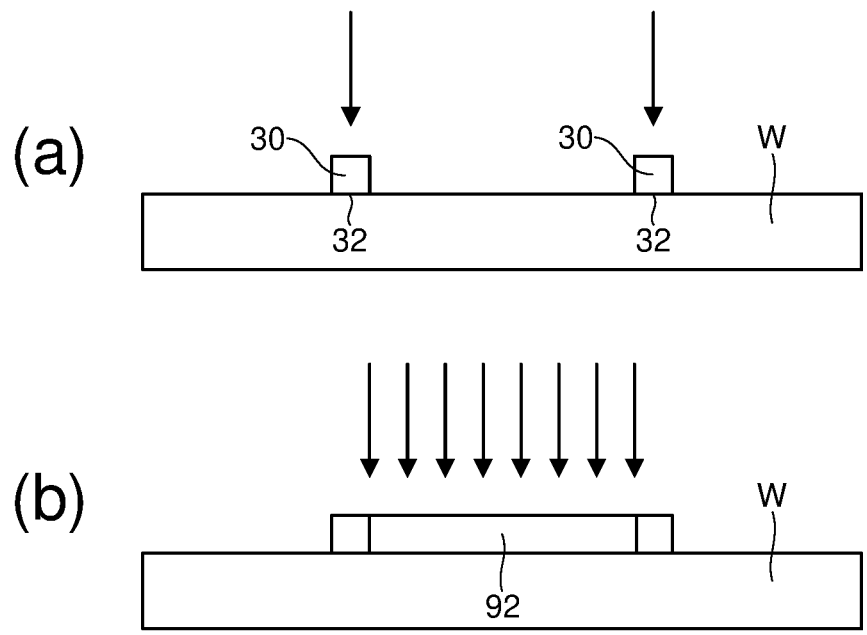
FIG. 13 schematically depicts an alternative two-step method in which a first radiation driven deposition process is used in a first step (a) to form a layer of deposited material that acts to locally inhibit a second radiation driven deposition process used in a second step (b)
Figure 14:
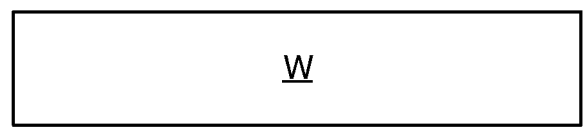
FIGS. 14-18 are side sectional views depicting a method of forming a patterned layer of material that comprises a repair process.

In the embodiments described above with reference to FIGS. 10-12, the material 30 or 94 formed in a first step (FIG. 10(a), 11(a) or 12(a)) acted as seed material for a subsequent further deposition process in a second step (FIG. 10(b), 11(b) or 12(b)). Any of these embodiments could be modified so that the deposited material 30 formed in the first step acts to locally inhibit growth rather than to seed growth. The local inhibition of growth may comprise blocking of growth in regions where the deposited material 30 is present. An example configuration corresponding to modification of the arrangement of FIGS. 11(a) and 11(b) is shown in FIGS. 13(a) and 13(b). In this embodiment, the composition of the layer of deposited material 30 formed in the first step (FIG. 13(a)) is chosen so as to locally inhibit growth of a further material 92 formed in a further deposition process performed in the second step (FIG. 13(b)). In an embodiment, the layer of deposited material 30 comprises nanoparticles chosen to provide the local inhibition of growth. In the case where the further material 92 to be formed comprises $MoS_2$ or $WS_2$, the layer of deposited material 30 acting to locally inhibit growth may comprise Ni or Co (which have been found to be most stable at the periphery of sheets of $MoS_2$ or $WS_2$). The layer of deposited material 30 may, for example, be patterned so as to define the outline of an intended shape of the further material 92 to be formed on the substrate W. Growth of the further material 92 in the further deposition process may thus start (e.g. by seeding) at a location within the defined outline and continue in all directions until the outline is reached (which inhibits or blocks growth beyond the outline). This process results in the region within the defined outline being filled with the further material 92, thereby forming the further material 92 reliably in the intended shape. Use of radiation driven deposition in the first step allows the deposited material 30 to be positioned and/or patterned with high accuracy, which allows the shape of further material 92 formed by the further deposition process to be controlled with high accuracy. In an embodiment, the layer of material 30 is formed in a pattern (defined by the irradiation) that comprises one or more closed loops. The closed loops define closed outlines of regions within which the further material 92 can be grown within leaking out into regions where the further material 92 should not be present. In the example shown, the second step (FIG. 13(b)) also comprises a radiation driven deposition process, but this is not essential. The second step (FIG. 13(b)) could be performed without any radiation driving or the radiation driving could be performed at a lower resolution than in the first step (e.g. using a cheaper lithographic apparatus) without excessive reduction in the accuracy of the final pattern of further material 92 (because of the constraining of the pattern by the accurately formed deposited material 30).

The embodiments may further be described using the following clauses:

1. A method of forming a patterned layer of material, comprising:
   irradiating a selected portion of a surface of a substrate during a deposition process, the irradiation being such as to locally drive the deposition process in the selected portion and thereby form a layer of deposited material in a pattern defined by the selected portion; and
   annealing the deposited material to modify the deposited material.

2. The method of clause 1, wherein the deposition process is configured to form a monolayer.

3. The method of clause 2, wherein the irradiation to drive the deposition process and the irradiation to anneal are performed in sequence and the sequence is repeated to progressively build up multiple monolayers of the deposited material in the selected portion.

4. The method of any preceding clause, wherein the annealing of the deposited material comprises:
   a first step in which all of the substrate is preheated to a target temperature above room temperature; and
   a second step, subsequent to the first step, in which a selected local region of the substrate is heated to a temperature above the target temperature, the selected local region being smaller than the whole substrate.

5. The method of any preceding clause, wherein:
   a first radiation source is used to provide the irradiation to drive the deposition process;
   a second radiation source is used to anneal the deposited material; and
   the first radiation source is different to the second radiation source.
6. The method of clause 5, wherein the first radiation source and the second radiation source irradiate the substrate from opposite sides of the substrate.
7. The method of clause 5, wherein the first radiation source and the second radiation source irradiate the substrate from the same side of the substrate.
8. The method of any of clauses 1 to 4, wherein the same radiation source is used at different times to provide the irradiation to drive the deposition process and irradiation to anneal the deposited material.
9. The method of clause 8, wherein the irradiation to drive the deposition process is performed with a finer spatial resolution than the irradiation to anneal the deposited material.
10. The method of clause 8 or 9, wherein the irradiation to drive the deposition process and the irradiation to anneal the deposited material use radiation having a wavelength of less than 100 nm.
11. The method of any of clauses 8 to 10, wherein the irradiation to drive the deposition process is performed using a patterning device to pattern a radiation beam and thereby define the pattern of the layer of deposited material and the irradiation to anneal the deposited material is performed using a different patterning device or no patterning device.
12. The method of any preceding clause, wherein the modification of the deposited material comprises increasing a degree of crystallinity of the deposited material.
13. The method of any preceding clause, wherein the irradiation to drive the deposition process is performed using electromagnetic radiation having a wavelength of less than 100 nm.
14. The method of any preceding clause, wherein the deposited material comprises carbon.
15. The method of any of clauses 1 to 13, wherein the deposited material comprises boron.
16. The method of any preceding clause, wherein:
   the irradiation to drive the deposition process is performed using radiation having a wavelength of less than 100 nm in combination with one or more of the following: an electron beam;
   radiation having a wavelength in the range of 100 nm to 400 nm; and laser radiation.
17. A method of forming a patterned layer of material, comprising:
   irradiating a selected portion of a surface of a substrate during a deposition process, the irradiation being such as to locally drive the deposition process in the selected portion and thereby form a layer of deposited material in a pattern defined by the selected portion, wherein:
   the irradiation is performed using radiation having a wavelength of less than 100 nm in combination with one or more of the following: an electron beam; radiation having a wavelength in the range of 100 nm to 400 nm; and laser radiation.
18. A method of forming a patterned layer of material, comprising:
   irradiating a selected portion of a surface of a substrate with electromagnetic radiation having a wavelength of less than 100 nm during a deposition process, the irradiation being such as to locally drive the deposition process in the selected portion and thereby cause the deposition process to form a layer of material in a pattern defined by the selected portion,
   wherein the deposited material comprises boron.
19. The method of clause 18, wherein the irradiation of the selected portion is performed by scanning a radiation beam over the substrate.
20. A method of forming a patterned layer of material, comprising:
   using a deposition process to form a layer of material; and
   irradiating a selected portion of the layer of material with radiation comprising an electron beam, the irradiation being such as to cause removal of the layer of material in the selected portion and thereby form a layer of material in a pattern defined by the selected portion.
21. The method of clause 20, wherein the irradiation is performed in the presence of either or both of hydrogen and a hydrogen plasma over at least the selected portion being irradiated.
22. The method of any preceding clause, wherein the deposition process comprises one or more of the following: atomic layer deposition; chemical vapor deposition; plasma-enhanced chemical vapor deposition; epitaxy; sputtering; and electron beam-induced deposition.
23. The method of any preceding clause, wherein:
   the substrate comprises at least a first layer and a second layer before the irradiation of the selected portion of the surface of the substrate during the radiation driven deposition process;
   the radiation driven deposition process forms the layer of deposited material on the first layer of the substrate; and
   either or both of the following is satisfied: a) the first layer has a higher absorbance per unit depth, with respect to the radiation used for the radiation driven deposition process, than the second layer; and b) the first layer acts as a catalyst with respect to the radiation driven deposition process such that the deposition process can proceed at a lower temperature than if the deposition process were performed directly on the second layer with the first layer not being present.
24. A method of forming a patterned layer of material, comprising:
   irradiating a selected portion of a surface of a substrate during a deposition process, the irradiation being such as to locally drive the deposition process in the selected portion and thereby form a layer of deposited material in a pattern defined by the selected portion, wherein:
   the substrate comprises at least a first layer and a second layer before the irradiation of the selected portion of the surface of the substrate during the radiation driven deposition process;
   the radiation driven deposition process forms the layer of deposited material on the first layer of the substrate; and
   either or both of the following is satisfied: a) the first layer has a higher absorbance per unit depth, with respect to the radiation used for the radiation driven deposition process, than the second layer; and b) the first layer acts as a catalyst with respect to the radiation driven deposition process such that the deposition process can proceed at a lower temperature than if the deposition process were performed directly on the second layer with the first layer not being present.
25. The method of any preceding clause, further comprising performing a further deposition process seeded or locally inhibited by deposited material of the layer of deposited material formed by the radiation driven deposition process.

26. A method of forming a patterned layer of material, comprising:
  irradiating a selected portion of a surface of a substrate during a deposition process, the irradiation being such as to locally drive the deposition process in the selected portion and thereby form a layer of deposited material in a pattern defined by the selected portion, wherein:
  the method comprises performing a further deposition process seeded or locally inhibited by deposited material of the layer of deposited material formed by the radiation driven deposition process.

27. The method of clause 25 or 26, wherein the further deposition process is performed using irradiation to locally drive the further deposition process to at least partly define a pattern of further material formed using the further deposition process.

28. The method of any preceding clause, wherein the radiation driven deposition process is seeded or locally inhibited by deposited material formed at an earlier time.

29. A method of forming a patterned layer of material, comprising:
  providing a layer of material in an initial pattern on a substrate; and
  irradiating a selected portion of the substrate during a deposition process seeded or locally inhibited by material of the layer of material in the initial pattern, the irradiation being such as to locally drive the deposition process in the selected portion and thereby form a layer of deposited material in a pattern at least partly defined by the selected portion.

30. A method of forming a patterned layer of material, comprising:
  irradiating a selected portion of a surface of a substrate during a deposition process, the irradiation being such as to locally drive the deposition process in the selected portion and thereby form a layer of deposited material in a pattern defined by the selected portion, wherein:
  the substrate comprises at least a first layer and a second layer before the irradiation of the selected portion of the surface of the substrate during the radiation driven deposition process;
  the radiation driven deposition process forms the layer of deposited material on the first layer of the substrate; and
  the method further comprises annealing the first layer to modify the first layer in a process that is locally catalysed by the layer of deposited material.

31. The method of clause 30, wherein the first layer comprises amorphous carbon and the modification of the first layer comprises forming graphene from the amorphous carbon.

32. A method of forming a patterned layer of material, comprising:
  irradiating a selected repair portion of a pre-existing patterned layer of material on a substrate, the irradiation being such as to locally drive a repair process in the selected repair portion to at least partially correct one or more imperfections in the pre-existing patterned layer of material, the repair process comprising one or more of the following in the selected repair portion: modification of material; deposition of material; and removal of material.

33. The method of clause 32, wherein the repair process comprises deposition of new material in a first sub-portion of the selected repair portion and removal of material in a second sub-portion of the selected repair portion.

34. The method of clause 32 or 33, wherein the irradiation is performed using radiation having a wavelength of less than 100 nm.

35. A method of forming a semiconductor device, comprising using the method of any preceding clause to form at least one layer in the device.

36. An apparatus for forming a patterned layer of material, comprising:
  an irradiation system configured to irradiate a selected portion of a surface of a substrate during a deposition process, the irradiation being such as to locally drive the deposition process in the selected portion and thereby form a layer of deposited material in a pattern defined by the selected portion; and
  an annealing system configured to anneal the deposited material to modify the deposited material.

37. An apparatus for forming a patterned layer of material, comprising:
  a first irradiation system configured to irradiate a selected portion of a surface of a substrate during a deposition process with radiation having a wavelength of less than 100 nm; and
  a second irradiation system configured to irradiate the selected portion of the surface of the substrate during the deposition process with one or more of the following: an electron beam; radiation having a wavelength in the range of 100 nm to 400 nm; and laser radiation, wherein:
  the first irradiation system and the second irradiation system are configured such that the irradiation locally drives the deposition process in the selected portion to cause formation of a layer of deposited material in a pattern defined by the selected portion.

38. The apparatus of clause 36 or 37, wherein each irradiation system comprises a lithographic apparatus configured to provide the irradiation of the selected portion by projecting a patterned radiation beam from a patterning device onto the substrate.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of forming a patterned layer of material, the method comprising:
  irradiating a selected portion of a surface of a substrate during an atomic layer deposition process, the irradiation being such as to locally drive the deposition process in the selected portion and form a layer of deposited material in a pattern defined by the selected portion and wherein the irradiation to drive the deposition process is performed using electromagnetic radiation having a wavelength of less than 100 nm; and annealing the deposited material to modify the deposited material.

2. The method of claim 1, wherein the deposition process is configured to form a monolayer.

3. The method of claim 2, wherein the irradiation to drive the deposition process and the anneal are performed in sequence and the sequence is repeated to progressively build up multiple monolayers of the deposited material in the selected portion.

4. The method of claim 1, wherein the annealing of the deposited material comprises:
a first step in which all of the substrate is preheated to a target temperature above room temperature; and
a second step, subsequent to the first step, in which a selected local region of the substrate is heated to a temperature above the target temperature, the selected local region being smaller than the whole substrate.

5. The method of claim 1, wherein:
a first radiation source is used to provide the irradiation to drive the deposition process;
a second radiation source is used to anneal the deposited material; and
the first radiation source is different to the second radiation source.

6. The method of claim 1, wherein a radiation source is used to provide the irradiation to drive the deposition process, wherein the same radiation source is used to provide irradiation to anneal the deposited material, and wherein the same radiation source is used at different times to provide the irradiation to drive the deposition process and provide irradiation to anneal the deposited material.

7. The method of claim 6, wherein the irradiation to drive the deposition process is performed with a finer spatial resolution than the irradiation to anneal the deposited material.

8. The method of claim 6, wherein the irradiation to drive the deposition process is performed using a patterning device to pattern a radiation beam to define the pattern of the layer of deposited material and the irradiation to anneal the deposited material is performed using a different patterning device or no patterning device.

9. The method of claim 1, wherein the modification of the deposited material comprises increasing a degree of crystallinity of the deposited material.

10. The method of claim 1, wherein the deposited material comprises carbon.

11. The method of claim 1, wherein the deposited material comprises boron.

12. The method of claim 1, wherein the irradiation to drive the deposition process is performed using radiation having a wavelength of less than 100 nm in combination with one or more selected from: an electron beam, radiation having a wavelength in the range of 100 nm to 400 nm, and/or laser radiation.

13. A method of forming a patterned layer of material, the method comprising:
irradiating a selected portion of a surface of a substrate during an atomic layer deposition process, the irradiation being such as to locally drive the deposition process in the selected portion to form a layer of deposited material in a pattern defined by the selected portion,
wherein the irradiation is performed using radiation having a wavelength of less than 100 nm in combination with one or more selected from: an electron beam, radiation having a wavelength in the range of 100 nm to 400 nm, and/or laser radiation.

14. The method of claim 13, wherein the deposited material comprises boron.

15. The method of claim 13, wherein:
the substrate comprises at least a first layer and a second layer before the irradiation of the selected portion of the surface of the substrate during the radiation driven deposition process;
the radiation driven deposition process forms the layer of deposited material on the first layer of the substrate; and
either or both of the following is satisfied: a) the first layer has a higher absorbance per unit depth, with respect to the radiation used for the radiation driven deposition process, than the second layer; and b) the first layer acts as a catalyst with respect to the radiation driven deposition process such that the deposition process can proceed at a lower temperature than if the deposition process were performed directly on the second layer with the first layer not being present.

16. The method of claim 13, further comprising performing a further deposition process seeded or locally inhibited by deposited material of the layer formed by the radiation driven deposition process.

17. The method of claim 13, wherein the deposition process is configured to form a monolayer.

* * * * *